(12) United States Patent
Takahama

(10) Patent No.: US 10,419,729 B2
(45) Date of Patent: Sep. 17, 2019

(54) ADJUSTMENT IMAGE GENERATING DEVICE, ADJUSTMENT IMAGE GENERATING METHOD, AND STORAGE MEDIUM HAVING PROGRAM STORED THEREIN

(71) Applicant: CASIO COMPUTER CO., LTD, Tokyo (JP)

(72) Inventor: Toru Takahama, Tokyo (JP)

(73) Assignee: CASIO COMPUTER CO., LTD, Tokyo (JP)

( * ) Notice: Subject to any disclaimer, the term of this patent is extended or adjusted under 35 U.S.C. 154(b) by 0 days.

(21) Appl. No.: 16/141,296

(22) Filed: Sep. 25, 2018

(65) Prior Publication Data

US 2019/0098265 A1 Mar. 28, 2019

(30) Foreign Application Priority Data

Sep. 27, 2017 (JP) .................................. 2017-186280

(51) Int. Cl.
| | |
|---|---|
| *H04N 9/31* | (2006.01) |
| *G03B 21/13* | (2006.01) |
| *G03B 21/20* | (2006.01) |
| *H01S 5/14* | (2006.01) |
| *G03B 21/00* | (2006.01) |

(52) U.S. Cl.
CPC ............ *H04N 9/31* (2013.01); *G03B 21/008* (2013.01); *G03B 21/2033* (2013.01); *H01S 5/141* (2013.01); *H04N 9/3111* (2013.01)

(58) Field of Classification Search
CPC ...... H04N 9/31; H04N 9/3111; H04N 9/3114; G03B 21/14; G03B 21/2033; G03B 21/008; G03B 21/005; G03B 21/204
See application file for complete search history.

(56) References Cited

U.S. PATENT DOCUMENTS

| | | | | |
|---|---|---|---|---|
| 7,889,214 | B2 * | 2/2011 | Doser .................. | H04N 9/3114 345/690 |
| 8,027,108 | B2 * | 9/2011 | Pettitt .................. | G02B 26/008 353/20 |
| 2014/0204558 | A1 * | 7/2014 | Bartlett ................ | G02B 26/008 362/84 |

FOREIGN PATENT DOCUMENTS

JP 2012-003213 A 1/2012

\* cited by examiner

*Primary Examiner* — William C. Dowling
(74) *Attorney, Agent, or Firm* — Fitch, Even, Tabin & Flannery LLP

(57) ABSTRACT

An adjustment image for facilitating adjustment is generated. An image display device according to an embodiment of the invention includes a semiconductor laser, a wheel, an adjustment image generating unit, and a projection unit. The semiconductor laser emits light. The wheel includes a first area and a second area as areas for adjusting color components of the light emitted from the semiconductor laser. The adjustment image generating unit generates an adjustment image in which a first color formed using a section adjacent to a boundary between the first area and the second area and a second color formed not using the section adjacent to the boundary and having color components close to the first color are arranged adjacent to each other. The projection unit projects the adjustment image generated by the adjustment image generating unit.

12 Claims, 6 Drawing Sheets

ADJUSTMENT IMAGE GENERATING DEVICE, ADJUSTMENT IMAGE GENERATING METHOD, AND STORAGE MEDIUM HAVING PROGRAM STORED THEREIN

CROSS-REFERENCE TO RELATED APPLICATIONS

This application is based upon and claims the benefit of priority under 35 USC 119 of Japanese Patent Application No. 2017-186280 filed on Sep. 27, 2017, the entire disclosure of which, including the description, claims, drawings, and abstract, is incorporated herein by reference in its entirety.

BACKGROUND OF THE INVENTION

Field of the Invention

The embodiment relates to an adjustment image generating device, an adjustment image generating method, and a storage medium having a program stored therein that can be applied to an image display device using a wheel.

Related Art

In general, in an image display device (for example, a projector) using a wheel such as a color wheel or a fluorescent wheel, it is necessary to detect a rotational position of the wheel that performs color separation of light incident from a light source and to perform synchronization control with a modulation element such as a digital micromirror device (DMD). When this synchronization control is not appropriate, a defect such as color mixture may occur in a display image.

A technique using a rotational position detection signal (an index signal) of a wheel has been widely used as a technique for performing synchronization control. In the technique using an index signal, synchronization control can be implemented by detecting a rotational position detection mark provided in a rotary portion of the wheel using a reflective photointerrupter (an index sensor) and employing an index signal which is generated on the basis of the detection timing.

Here, in order to accurately perform synchronization control using an index signal, an attachment state between a wheel and a motor for driving the wheel or an attachment position of a rotational position detection mark need to be proper as a premise.

However, in a process of manufacturing an image display device, attachment of a wheel or attachment of a rotational position detection mark may be performed manually. When such work is performed manually, an error such as a position offset occurs necessarily and thus the timing of an index signal is offset. Therefore, for example, as disclosed in JP 2012-3213 A, it is necessary to perform adjustment of the synchronization timing between an index signal of a wheel and transmitted light for each product.

SUMMARY OF THE INVENTION

As described above, timing adjustment is often performed manually with reference to an adjustment image for adjustment such that color mixture or the like does not occur in a projected image. However, since it is difficult to provide an adjustment image for simply performing adjustment, there is a problem in that adjustment accuracy of the timing of an index signal decreases due to unevenness in skill of operators or quality is not stabilized.

The embodiment is made in consideration of the above-mentioned circumstances and an objective thereof is to provide a technique for generating an adjustment image for simply adjusting the timing of an index signal.

One aspect of the embodiment is an adjustment image generating device comprising: a light source unit that emits light; a wheel that includes a first area and a second area as areas for adjusting color components of the light emitted from the light source unit; and a processor, wherein the processor perform a generation process of generating an adjustment image in which a first color formed using a section adjacent to a boundary between the first area and the second area and a second color formed not using the section adjacent to the boundary and having color components close to the first color are arranged adjacent to each other, a projection process of projecting the adjustment image generated in the generation process.

According to the embodiment, it is possible to provide a technique for generating an adjustment image for simply performing adjustment.

DETAILED DESCRIPTION OF THE INVENTION

Hereinafter, an embodiment will be described with reference to the accompanying drawings.

An image display device according to the embodiment projects an adjustment image and performs an adjustment process based on the adjustment image. At this time, the image display device uses a boundary adjacent section called a spoke period which is disposed in a boundary portion between a reflection area and a transmission area of a wheel and which is formed by light incident from a light source in order to correct an offset of an index signal. This is because it can be easily seen that, since an application area of projection light applied to the wheel goes over the boundary portion due to a slight offset of the index signal and thus a color formed using the boundary adjacent section includes another color, a color of an input image signal is different from a color of an actually projected image. For example, the image display device generates an adjustment image by mixing two colors which are different by one gradation and which includes a first color formed using the boundary adjacent section and a second color formed not using the boundary adjacent section and having a color component close to the first color such that a geometric pattern is formed. The image display device projects the adjustment image.

In the adjustment image, when the color of the boundary adjacent section of the boundary portion is correct (that is, the index signal does not have an offset), a variation in gradation is smooth and thus there seems to be no variation with a resolution of human eyes. However, when the color of the boundary adjacent section has an offset (that is, the index signal has an offset), a variation in gradation is fast and a geometric pattern appears.

Accordingly, for example, an operator who performs adjustment manually can strictly correct the synchronization timing of the index signal by adjusting an index delay such that such a geometric pattern does not, appear. It is also possible to simply determine whether it is necessary to perform adjustment by confirming whether a geometric pattern appears before starting the adjustment operation.

[Hardware Configuration]

Figure 1:
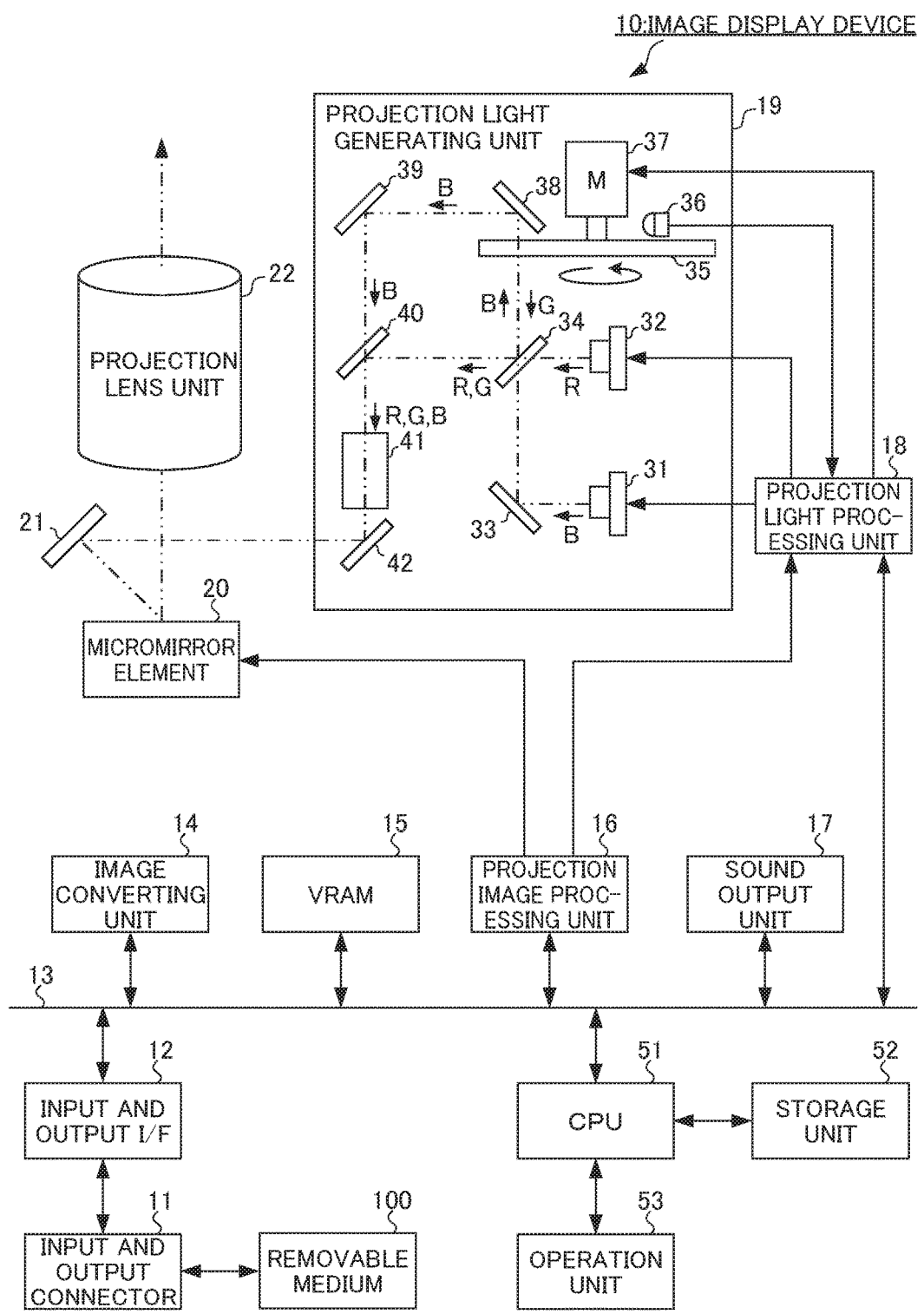
FIG. 1 is a block diagram illustrating a hardware configuration of an image display device according to an embodiment.

FIG. 1 is a block diagram illustrating a hardware configuration of an image display device 10 according to an embodiment of the embodiment. The image display device 10 is configured, for example, as a projector based on a digital light processing (DLP) system.

The image display device 10 includes an input and output connector 11, an input and output interface (I/F) 12, a system bus 13, an image converting unit 14, a video RAM (VRAM) 15, a projection image processing unit 16, a sound output unit 17, a projection light processing unit. 18, a projection light generating unit 19, a micromirror element 20, a mirror 21, a projection lens unit 22, a (B light emission) semiconductor laser 31, a. (R light emission) LED 32, a mirror 33, a dichroic mirror 34, a color wheel, an index sensor 36, a motor (M) 37, a mirror 38, a mirror 39, a dichroic mirror 40, an integrator 41, a mirror 42, a central processing unit (CPU) 51, a storage unit 52, and an operation unit 53.

Among these units, the input and output interface (I/F) 12, the system bus 13, the image converting unit 14, the video RAM (VRAM) 15, the projection image processing unit 16, the sound output unit 17, the projection light processing unit 18, and the CPU 51 are connected to each other such that data can be transmitted and received via the system bus 13.

The input and output connector 11 is a terminal that is used to input image data, which is projected by the image display device 10, from an external device. The input and output connector 11 is implemented, for example, by a high-definition multimedia interface (HDMI (registered trademark)) terminal, a pin jack (RCA) type video input terminal, a D-sub15 type RGB input terminal, a universal serial bus (USB) connector, or the like. A removable medium 101 such as a magnetic disk, an optical disc, a magneto-optical disc, or a semiconductor memory in which a program, image data, or the like is stored is appropriately attached to the input and output connector 11.

A program read from the removable medium 101 by the input and output connector 11 is installed in the storage unit 52 if necessary. The removable medium 101 can store various data stored in the storage unit 52 in the same way as the storage unit 52.

Image data which is input to the input and output connector 11 and which is based on various standards is input to the image converting unit 14 via the input and output interface (illustrated as an "input and output. I/F" in the drawing) 12 and the system bus 13.

The image converting unit 14 converts image data input from the input and output connector 11 into an image signal in a predetermined format suitable for projection. The image converting unit 14 outputs the converted image signal to the projection image processing unit 16. The VRAM 15 is a buffer memory for image processing and is appropriately used as a buffer when an image signal is output from the image converting unit 14 to the projection image processing unit 16. At this time, data such as symbols indicating various operation states for USD (On-Screen Display) may be superimposed and processed on the image signal by the VRAM 15 if necessary. In this case, the processed image signal is read and is output to the projection image processing unit 16.

The projection image processing unit 16 controls driving of the micromirror element. 20 by time-divisional driving in which a frame rate based on a predetermined format, the number of divided color components, and the number of display gradations are multiplied in accordance with the image signal input from the image converting unit 14.

The micromirror element 20 is a spatial optical modulation element that is driven under the control of the projection image processing unit 16. In the micromirror element 20, slope angles of a plurality of small mirrors corresponding to a plurality of pixels (for example, lateral 1024 pixels× longitudinal 768 pixels corresponding to XGA) which are arranged in an array are individually switched between ON and OFF at a high speed. The micromirror element 20 is switched between ON and OFF at a high speed in this way and forms a light image corresponding to the image signal using reflected light emitted to the projection lens unit 22 at the time of ON.

On the other hand, primary color light of Red (R), Green (G), and Blue (B) is cyclically emitted from the projection light generating unit 19. Primary color light from the projection light generating unit 19 is totally reflected by the mirror 21 and is applied to the micromirror element 20. In this way, by adjusting a time in which the micromirror element 20 is in ON for each predetermined period which is determined for each of the primary color light of RGB incident on the micromirror element 20, color adjustment is performed such that color components corresponding to the input image signal are obtained.

A light image is formed using reflected light from the micromirror element 20, and the formed light image is projected and displayed on a screen (not illustrated) serving as a projection object via the projection lens unit 22.

The projection light generating unit 19 includes two types of light sources. Specifically, the semiconductor laser 31 that emits a blue laser beam and the LED 32 that emits red light are provided. Characters of R, G, and B illustrated along with arrows in the projection light generating unit 19 in the drawing indicate colors of the laser beam (one of R, and B) and a traveling direction of the laser beam.

The blue laser beam emitted from the semiconductor laser 31 is totally reflected by the mirror 33, passes through the dichroic mirror 34, and is applied to one point on the circumference of a wheel 35. The wheel 35 is constituted by an annular member and is rotated basically at a constant speed by a motor 37. A transmission area transmitting light and a reflection area reflecting light are provided on the circumference of the wheel 35 to which a laser beam is applied. The area transmitting light has a function of a diffuser that diffuses light. The reflection area reflecting light is coated with a fluorescent paint and has a function of a green fluorescent reflector. The more detailed configuration of the wheel 35 will be described later with reference to FIG. 3.

When the transmission area of the wheel 35 is located at a position at which a laser beam is applied, the laser beam is transmitted by the wheel 35 while being diffused in the transmission area and is then totally reflected by the mirror 38 and the mirror 39. Thereafter, the blue laser beam is transmitted by the dichroic mirror 40, is converted into a light flux with a substantially uniform luminance distribution by the integrator 41, is totally reflected by the mirror 42, and is then sent to the mirror 21.

When the reflection area of the wheel 35 is located at the position to which a laser beam is applied, green light is excited by application of the laser beam, and the excited green light is reflected by the wheel 35 and then is also reflected by the dichroic mirror 34. Thereafter, the green light is additionally reflected by the dichroic mirror 40, is converted into a light flux with a substantially uniform luminance distribution by the integrator 41, is totally reflected by the mirror 12, and is sent to the mirror 21.

The red light emitted from the LED 32 is transmitted by the dichroic mirror 34, is reflected by the dichroic mirror 40, is converted into a light flux with a substantially uniform luminance distribution by the integrator 41, is totally reflected by the mirror 42, and is sent to the mirror 21.

As described above, the dichroic mirror 34 has spectral characteristics that it transmits blue light and red light but reflects green light. The dichroic mirror 40 has spectral characteristics that it transmits blue light but reflects red light and green light.

The index sensor 36 is disposed at a position at which a rotational position detection mark disposed in a rotary portion of the wheel can be detected. The index sensor 36 is implemented by a reflective photointerrupter and generates an index signal indicating the detection timing of the rotational position detection mark. The index sensor 36 outputs the generated index signal to the projection light processing unit 18.

An optical sensor (not illustrated) is disposed to face the light emission side of the integrator 41. The optical sensor serves to detect only luminance regardless of colors of light. Information of the luminance detected by the optical sensor is output to the projection light processing unit 18.

The projection light processing unit 18 controls emission timings and emission intensities of the semiconductor laser 31 and the LED 32 in the projection light generating unit 19 and rotation of the wheel 35 by the motor 37 on the basis of a timing signal in the image signal input from the projection image processing unit 16, the index signal input from the index sensor 36, the information of luminance input from the optical sensor, and the like. This control using the projection light processing unit 18 is performed on the basis of comprehensive control using the CPU 51 which will be described later.

All the operations of the circuits are comprehensively controlled by the CPU 51. For this comprehensive control, the storage unit 52 includes semiconductor memories such as a read only memory (RCM), a random access memory (RAM), and a dynamic random access memory (DRAM).

In these semiconductor memories included in the storage unit 52, driving current values of the LED 32 and the semiconductor laser 31 at the tame of emitting light of R, C, and B in a state in which white balance is taken at the time of shipment from a factory are stored as rated current values in addition to operation programs or various fixed-format data. Although will be described later with reference to FIG. 1, an index parameter storage unit in which a set value for performing control based on the index signal is stored is provided in the storage unit 52.

The CPU 51 performs various processes in accordance with a program stored in the ROM or a program loaded from the DRAM to the RAM. Data or the like required for the CPU 51 to perform various processes is also appropriately stored in the RAM.

The CPU 51 performs various projection operations or an index parameter adjusting operation in accordance with an operation signal which is a signal based on a key operation from a user which has been received by the operation unit 53. The operation unit 53 includes a key operating unit which is disposed in the body of the image display device 10 and a laser beam receiving unit that receives infrared light from a remote controller (not illustrated) dedicated for the image display device 10, and directly outputs a key operation signal based on a key operated by the user using the key operating unit of the body or operated by the remote controller to the CPU 51.

In the operation unit 53, both the key operating unit and the remote controller include, for example, a focusing adjustment key, a zoom adjustment key, an input switching key, a menu key, a cursor key, a set key, and a cancel key.

The CPU 51 also comprehensively controls the sound output unit 17. The sound output unit 17 includes a sound source circuit such as a PCM sound source and converts sound data, which is sent from the CPU 51 at the time of performing the projection operation, into analog data. The sound output unit 17 drives a speaker unit included therein to amplify and emit sound or to generate beep sound or the like if necessary.

[Functional Configuration]

Figure 2:
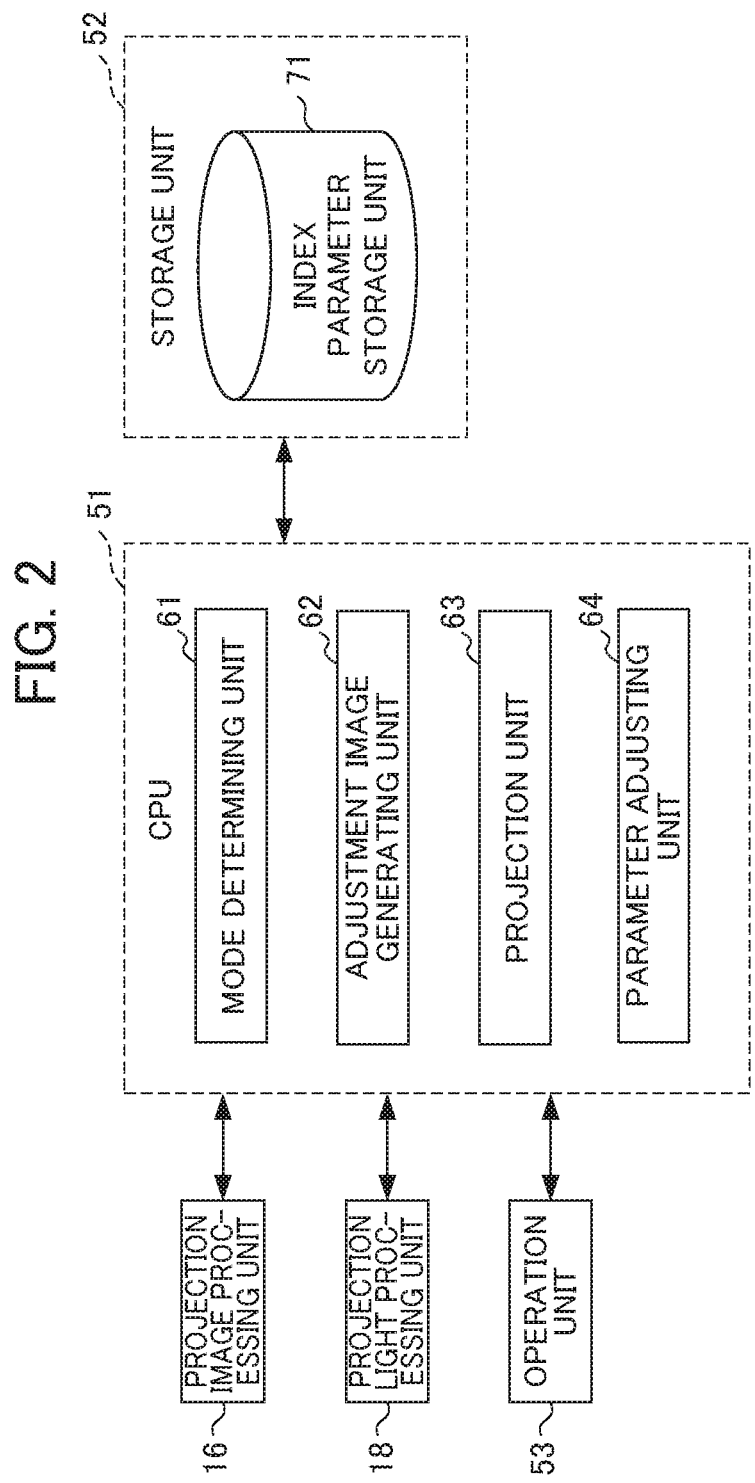
FIG. 2 is a functional block diagram illustrating a functional configuration for performing a parameter adjusting process in a functional configuration of the image display device illustrated in FIG. 1.

FIG. 2 is a functional block diagram illustrating a functional configuration for performing a parameter adjusting process in the functional configuration of the image display device 10 illustrated in FIG. 1. The parameter adjusting process refers to a sequence of processes of generating and projecting an adjustment image for adjusting an index parameter and adjusting the index parameter in response to an operation from a user with reference to the adjustment image.

When the parameter adjusting process is performed, a mode determining unit 61, an adjustment image generating unit 62, projection unit 63, and a parameter adjusting unit 64 are activated in the CPU 51 as illustrated in FIG. 2. An index parameter storage unit 71 is set in an area of the storage unit 52.

The mode determining unit 61 determines whether an operation instructing to start adjustment of an index parameter from the user has been received. Then, when it is determined that the operation instructing to start adjustment of an index parameter from the user has been received, the mode determining unit 61 switches an operation mode of the image display device 10 to a parameter adjustment mode. Accordingly, the parameter adjusting process is started. The mode determining unit 61 determines whether an operation instructing to end adjustment of an index parameter from the user has been received after the parameter adjusting process has been started. Then, when it is determined that the operation instructing to end adjustment of an index parameter from the user has been received, the mode determining unit 61 switches the operation mode of the image display device 10 from the parameter adjustment mode to a normal mode. Accordingly, the parameter adjusting process ends.

The adjustment image generating unit 62 generates an adjustment image. The projection unit 63 projects the adjustment image generated by the adjustment image generating unit 62 by controlling the projection image processing unit 16 or the projection light processing unit 18. The parameter adjusting unit 64 adjusts an index parameter in response to an operation of the operation unit 53 from the user with reference to the adjustment image.

The index parameter storage unit 71 stores an index parameter which is adjusted by the parameter adjusting unit 64. The index parameter is used for comprehensive control for displaying an image by the CPU 51 as described above.

Adjustment of an index parameter which is performed in cooperation of the functional blocks will be described below with reference to FIGS. 3 to 6C. First, the wheel 35 will be described with reference to FIG. 3. The wheel 35 is formed of an annular member and is basically rotated at a constant speed by the motor 37. A transmission area transmitting light and a reflection area reflecting light are provided on the circumference of the wheel 35 to which a laser beam is applied. The area transmitting light has a function of a diffuser that diffuses light. The reflection area reflecting light is coated with a fluorescent paint and has a function of a green fluorescent reflector.

When the transmission area of the wheel 35 is located at a position to which a laser beam is applied, the laser beam is transmitted by the wheel 35 while being diffused in the transmission area. When the reflection area of the wheel 35 is located at the position to which a laser beam is applied, green light is excited by application of the laser beam and the excited green light is reflected by the wheel 35. Later traveling of the transmitted light or the reflected light is the same as described above with reference to FIG. 1. For example, the transmission area of the wheel 35 is set to about a ¼ range of the whole circumference and the reflection area is set to the other ¾ range of the whole circumference.

When an image is projected, the motor 37 rotates the wheel 35, and the mirror installed for each pixel in the micromirror element 20 is switched between an angle at which incident light is reflected in a projection direction (a direction in which output light is valid) and an angle at which incident light is reflected in a direction in which light is absorbed (a direction in which output light is invalid) to generate the pixels of the projection image.

Figure 3:
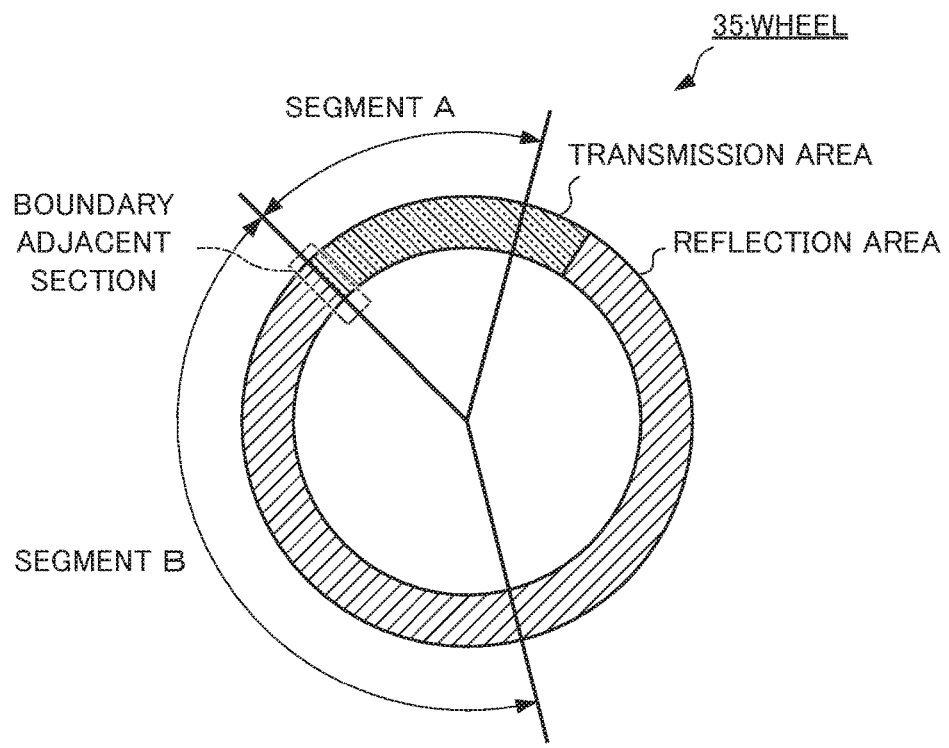
FIG. 3 is a schematic diagram illustrating an example of a configuration of a wheel.

In this case, it is necessary to control color components of R, G, and B, and the color components of G and B are adjusted by adjusting the time in which blue light is applied to the transmission area and the reflection area of the wheel 35 by ON/OFF control of the micromirror element 20. In this embodiment, the time is controlled such that blue light is applied to partial areas instead of the entire transmission area and the entire reflection area. For example, as illustrated in FIG. 3, the time is controlled such that blue light is applied to segment A which is a partial area of the transmission area and segment B which is a partial area of the reflection area.

Here, in order to control the time, it is necessary to detect a boundary between the transmission area and the reflection area in the wheel 35 on the basis of an index signal. Accordingly, a rotational position detection mark which is used for the index sensor 36 to generate an index signal is attached to a predetermined position on the wheel 35 (for example, a position corresponding to the boundary portion between segment A and segment B of the wheel 35). The index sensor 36 detects the rotational position detection mark and outputs an index signal indicating the detection timing of the rotational position detection mark to the projection light processing unit 18.

The projection light processing unit 18 can recognize to which of the transmission area and the reflection area of the wheel 35 blue light is applied on the basis of the index signal. However, when attachment of the rotational position detection mark is performed manually as described above, the attachment state may be uneven. Accordingly, an offset (an error) is caused at the timings corresponding to the index signal output from the index sensor 36 and a logical index signal used for the projection light processing unit 18 to control the wheel 35. Accordingly, it is not possible to accurately recognize the position of a boundary between a period in which the projection light processing unit 18 functions as a blue light source and a period in which the projection light processing unit 18 functions as a green light source (that is, the position of the boundary between segment A and segment B). A coated state of the boundary portion with a paint or the like has an individual difference, which also causes an error.

Therefore, in this embodiment, in order to correct an offset of the index signal, the adjustment image generating unit 62 generates an adjustment image using a near-boundary section (hereinafter referred to as a "boundary adjacent section") including the boundary between segment A and segment B of the wheel 35. This is because a color output using the boundary adjacent section goes over the boundary due to a slight offset of the index signal and the color corresponding to segment A and the color corresponding to segment B (that is, blue light and green light) are easily mixed.

Figure 4:
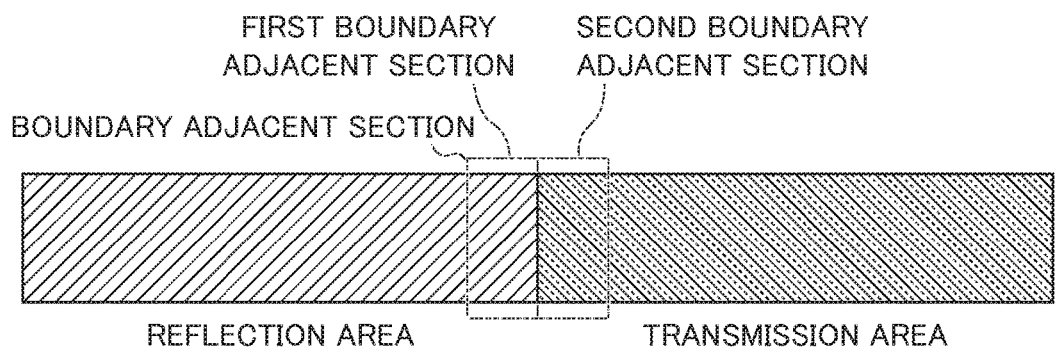
FIG. 4 is a schematic diagram illustrating an example of a boundary adjacent section in the wheel.

A schematic diagram in which the boundary adjacent section is enlarged in FIG. 3 is illustrated in FIG. 4. The boundary adjacent section includes a section on the reflection area side adjacent to the boundary (hereinafter referred to as a "first boundary adjacent section") and a section on the transmission area side adjacent to the boundary (hereinafter referred to as a "second boundary adjacent section"). Incidentally, the boundary adjacent section may be referred to as a "bit plane."

As a method of generating an adjustment image, for example, since a difference of one gradation in a color scale which is projected by the image display device 10 is not visually recognized by human eyes, the adjustment, image is generated by mixing two colors which are different by one gradation and which includes a first color formed using the boundary adjacent section and a second color formed not using the boundary adjacent section and having color components close to the first color such that a geometric pattern appears. When the boundary between the two color areas is clear, it means that a large offset occurs in the timings corresponding to an index signal output from the index sensor 36 and a color switching signal (a logical index signal) used for the projection light processing unit 18 to control the wheel 35. On the other hand, when the boundary between the two color areas is not clear, it means that an offset does not occur. Specifically, the micromirror element is controlled such that image areas of the first color and the second color are generated using colors which are acquired from monochromatic areas of segment. A (green) and segment B (blue) and the boundary adjacent section which is a mixed color area thereof. At this time, the first color and the second color are set such that a green component and a blue component which are formed using a section adjacent to the boundary therebetween are different by about one gradation.

For example, when an adjustment image is generated using the first color formed using the first boundary adjacent section and the second color formed not using the first boundary adjacent section, there is a likelihood that the boundary of the second color area will not appear clearly when the index signal is offset to the first boundary adjacent section side (that is, the reflection area side) even if an offset signal occurs in the index signal. Similarly, when an adjustment image is generated using the first color formed using the second boundary adjacent section and the second color formed not using the second boundary adjacent section, there is a likelihood that the boundary of the second color area will not appear clearly when the index signal is offset to the second boundary adjacent section side (that is, the transmission area side) even if an offset signal occurs in the index signal.

Figure 5:
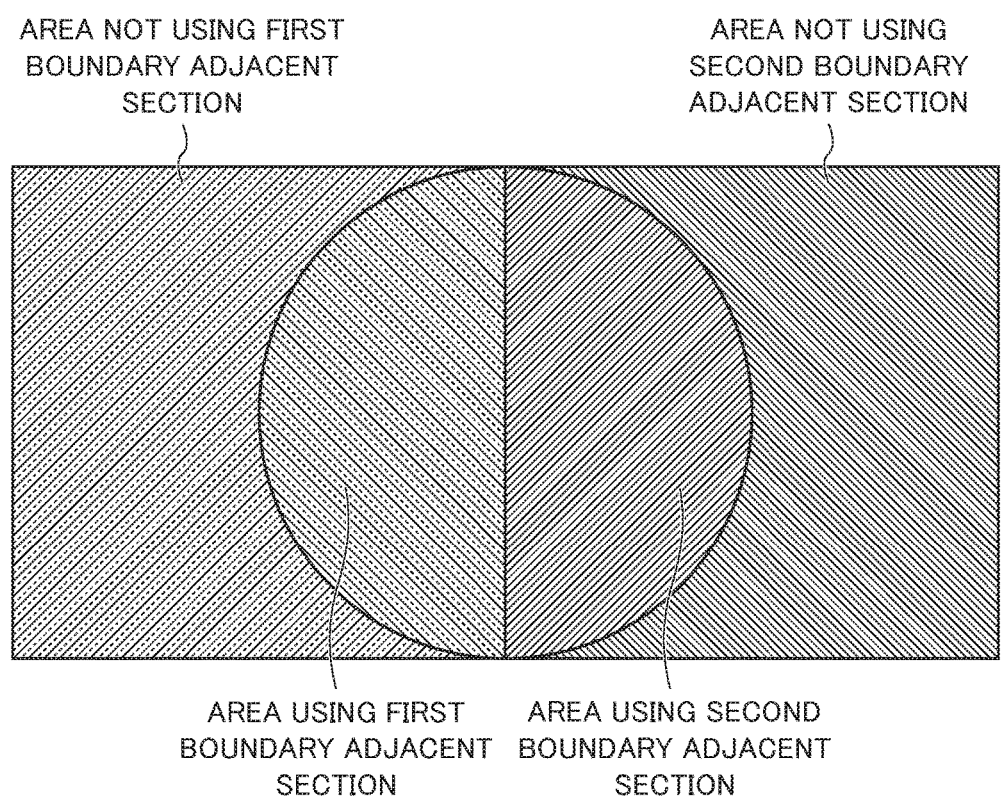
FIG. 5 is a schematic diagram illustrating an example of an adjustment image.

Therefore, four colors may be selected to generate an adjustment image. FIG. 5 illustrates an example of an adjustment image which is generated by selecting four colors. In this example, four colors are selected to generate an adjustment image. Specifically, as illustrated in FIG. 5, as the selected colors, four colors which are formed using or not using the first boundary adjacent section and the second boundary adjacent section and which are different by one gradation are selected to generate an adjustment image. In this case, when an offset occurs on the first boundary adjacent section side (that is, the reflection area side) and when an offset occurs on the second boundary adjacent section side (that is, the transmission area side), the boundary of one color area appears clearly and it is thus possible to more satisfactorily understand occurrence of an offset. It is also possible to understand on which of the first boundary adjacent section side and the second boundary adjacent section side an offset occurs.

For example, the gradations of the colors (R, G, B) of the areas may be set to (255, 37, 37) for the area not using the first boundary adjacent section, (255, 38, 38) for the area using the first boundary adjacent section, (255, 52, 52) for the area not using the second boundary adjacent section, and (255, 53, 53) for the area using the second boundary adjacent section in this case, when there is no offset in the index signal, a difference in gradation therebetween is sufficiently small and thus it is difficult to recognize the boundaries of the color areas with the user's eyes.

By employing the above-mentioned configuration, when a delay adjustment parameter of an index signal cannot be finely adjusted, it is possible to adjust the offset of the index signal with respect to the boundary of the actual wheel to a correct position without being offset to any of the first boundary adjacent section and the second boundary adjacent section, by adjusting the index signal such that the boundaries of the image areas corresponding to four colors cannot be recognized by a user.

The color scheme or the geometric pattern of the adjustment image illustrated in FIG. 5 is only an example, and the color scheme or the geometric pattern of the adjustment image generated by the adjustment image generating unit 62 is not limited to the example illustrated in FIG. 5.

In any case, when a boundary between the areas of colors which are different by one gradation appears clearly in the adjustment image, it means that there is a large offset in the timings corresponding to the index signal output from the index sensor 36 and the logical index signal used for the projection light processing unit 18 to control the wheel 35. Accordingly, in this embodiment, the index parameter is adjusted in a direction in which the offset is reduced by the parameter adjusting unit 64. Here, the index parameter is a parameter for determining the timing corresponding to the logical index signal used for the projection light processing unit 18 to control the wheel 35.

Figure 6A:
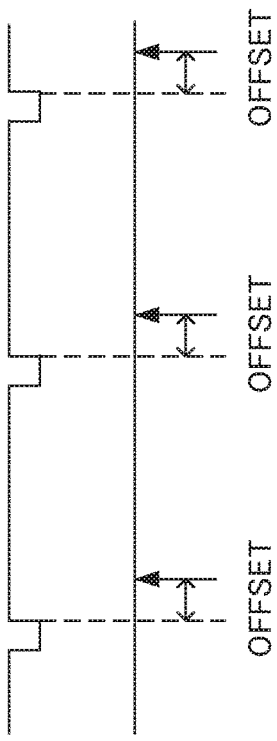
FIGS. 6A to 6C are timing charts illustrating an example of offset reduction by the parameter adjustment.
Figure 6B:
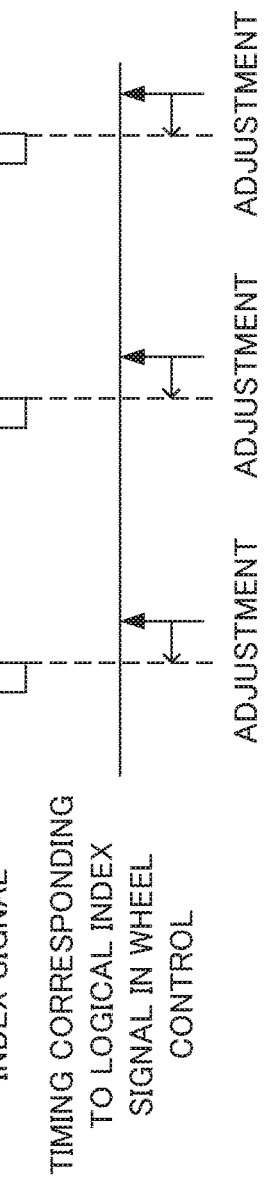
Figure 6C:
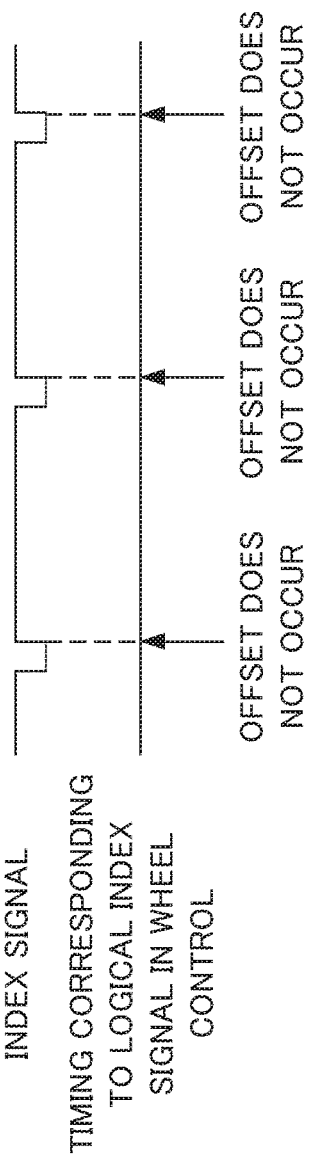

Adjustment by the parameter adjusting unit 64 will be described below with reference to the timing chart illustrated in FIGS. 6A to 6C. In FIGS. 6A to 6C, regarding the "index signal," the rising of a waveform indicates the timing at which the index sensor 36 detects the rotational position detection mark. Regarding the "timing corresponding to a logical index signal in wheel control," an upward arrow indicates the timing corresponding to the logical index signal used for the projection light processing unit 18 to control the wheel 35.

FIG. 6A illustrates a state in which there is an offset in the timings corresponding to the index signal output from the index sensor 36 and the logical index signal used for the projection light processing unit 18 to control the wheel 35. In this case, a boundary between areas of colors which are different by one gradation appears clearly in the adjustment image as described above.

As illustrated in FIG. 6B, a user performs an operation for adjusting the index parameter in a direction in which the offset is reduced with reference to the adjustment image. By causing the parameter adjusting unit 64 to adjust the index parameter in response to the adjusting operation, the offset is reduced and the timings corresponding to the index signal output from the index sensor 36 and the logical index signal used for the projection light processing unit 16 to control the wheel 35 match each other. In this case, a boundary between areas of colors which are different by one gradation does not appear clearly in the adjustment image as described above.

Accordingly, the projection light processing unit 18 can appropriately control the times in which blue light is applied to the transmission area and the reflection area of the wheel 35. Accordingly, it is possible to prevent a problem such as color mixture from occurring in an image which is projected by the image display device 10.

By performing this adjustment operation once, for example, at the time of shipment from a factory, it is possible to suppress the offset and to realize output of a target color. That is, according to this embodiment, it is possible to generate an adjustment image for easily performing adjustment and to provide the generated adjustment image to a user.

[Operation]

Figure 7:
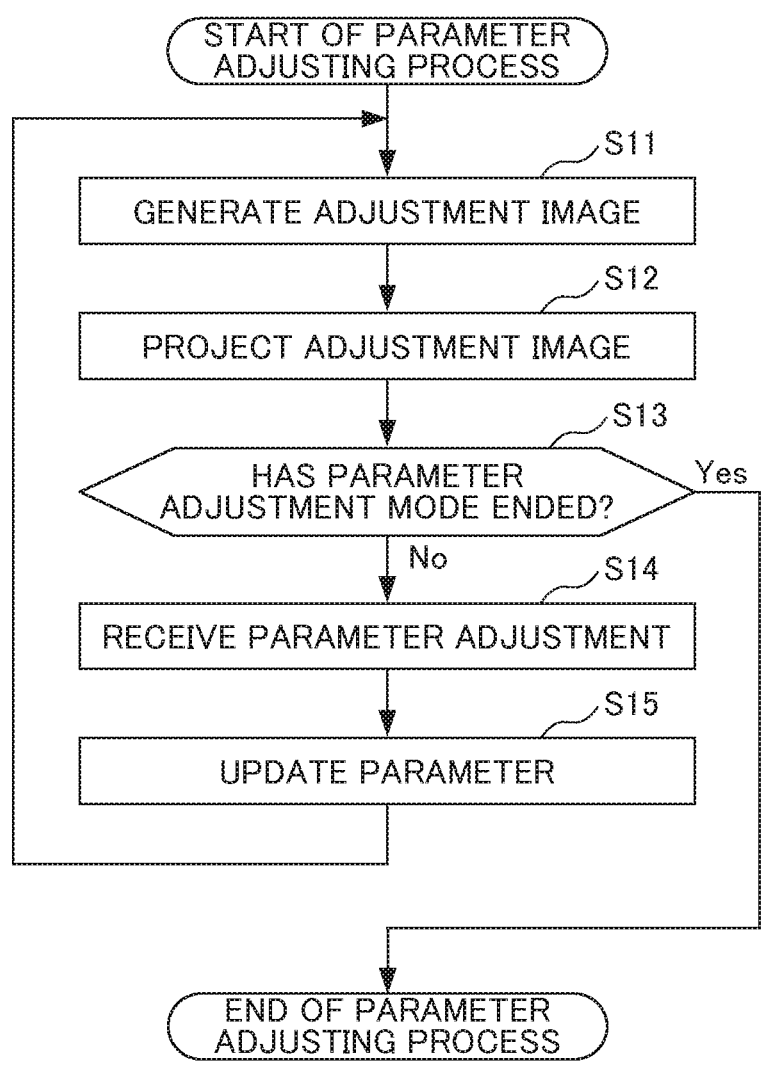
FIG. 7 is a flowchart illustrating a flow of the parameter adjusting process which is performed by the image display device illustrated in FIG. 1 with the functional configuration illustrated in FIG. 2.

The operation of the image display device 10 will be described below. FIG. 7 is a flowchart illustrating a flow of the parameter adjusting process which is performed by the image display device 10 illustrated in FIG. 1 with the functional configuration illustrated in FIG. 2. The parameter adjusting process is performed when an operation instructing to start adjustment of an index parameter has been received from a user by the operation unit 53.

In Step S11, for example, the adjustment image generating unit 62 generates the adjustment image illustrated in FIG. 5.

In Step S12, the projection unit 63 projects and displays the adjustment image generated in Step S11 on a screen (not illustrated) which is a projection object.

In Step S13, the mode determining unit 61 determines whether the operation unit 53 has received an operation for ending the index parameter adjustment mode from a user. When it is determined that the operation unit 53 has not received the operation for ending the index parameter adjustment mode from the user, the determination result of Step S13 is NO and the parameter adjusting process ends. This is a case in which a boundary between areas of colors which are different by one gradation does not appear clearly in the adjustment image and thus the user referring to the adjustment image determines that adjustment is not necessary.

On the other hand, when it is determined that the operation unit 53 has received the operation for ending the index parameter adjustment mode from the user, the determination result of Step S13 is YES and the process flow transitions to Step S14. This is a case in which a boundary between areas of colors which are different by one gradation appears clearly in the adjustment image and thus the user referring to the adjustment image determines that adjustment is necessary.

In Step S14, the parameter adjusting unit 64 receives a parameter adjusting operation from the user via the operation unit 53. The parameter adjusting operation is performed, for example, by pressing + and − buttons of the operation unit 53.

In Step S15, the parameter adjusting unit 64 adjusts and updates the index parameter stored in the index parameter storage unit 71 in response to the operation received in Step S14. Accordingly, an offset in the timings corresponding to the index signal output from the index sensor 36 and the logical index signal used for the projection light processing unit 18 to control the wheel 35 is reduced.

Thereafter, the process flow returns to Step S11, an adjustment image is generated again in a state in which the offset has been reduced, and the processes of Step S12 and the steps subsequent thereto are repeatedly performed. In the process of repetition, the offset is cancelled and the boundary between the areas of the colors which are different by one gradation does not appear clearly in the adjustment image. When the user having referred to the adjustment image determines that adjustment is not necessary, the determination result of Step S13 is NO and the parameter adjusting process ends.

Advantages

Advantages which are achieved by the above-mentioned embodiment will be described below. When there is an offset between an index signal and an image signal, a color offset occurs in a projected image. In general, this color offset is not marked when the offset in the index signal is small, but seems to be great at a specific gradation level. In order to accurately display any color, it is necessary to strictly correct the index signal.

Therefore, as described above, in this embodiment, an adjustment image including a geometric pattern and including a first color area using a color based on a section adjacent to a boundary portion between a G period and a B period in which there is a great influence due to the offset of the index signal and a second color area not using the boundary adjacent section and set to a gradation close to the first color is projected, for example, as illustrated in FIG. 5. A user adjusts the offset of the image signal such that a geometric pattern does not appear while checking the displayed adjustment image. Accordingly, it is possible to strictly correct the index signal. It is possible to determine whether adjustment is necessary by checking whether a geometric pattern appears before starting the adjustment operation. By geometrically arranging gradations, it is possible to enhance visibility and to facilitate adjustment by the user. That is, in this embodiment, it is possible to generate and provide an adjustment image for facilitating adjustment.

The image display device 10 having the above-mentioned configuration includes the semiconductor laser 31, the wheel 35, the adjustment image generating unit 62, and the projection unit 63. The semiconductor laser 31 emits light. The wheel 35 includes a first area and a second area as areas for adjusting color components of the light emitted from the semiconductor laser 31. The adjustment image generating unit 62 generates an adjustment image in which a first color using a section adjacent to a boundary between the first area and the second area and a second color not using the section adjacent to the boundary and having a color component close to the first color are arranged to be adjacent to each other. The projection unit 63 projects the adjustment image generated by the adjustment image generating unit 62. Accordingly, for example, it is possible to provide the adjustment image in which the first color formed using the boundary adjacent section extending over the reflection area and the transmission area of the wheel and the second color not using the boundary adjacent section and having a color component close to the first color are arranged to be adjacent to each other. Accordingly, it is possible to accurately correct the index signal. It is possible to check whether adjustment is necessary before the operation of adjusting the index signal is performed.

The adjustment image generating unit 62 selects colors which are different by one gradation in color components adjusted in the first area and the second area respectively, as the first color and the second color and generates the adjustment image. Accordingly, it is possible to easily ascertain an offset of the index signal.

The adjustment image generating unit 62 generates an adjustment image in which a first color on the first area using a section on the first area side adjacent to the boundary and a second color on the first area side not using the section on the first area side adjacent to the boundary are arranged as a first color set and a first color on the second area side using the section on the second area side adjacent to the boundary and the second color on the second area side not using the section on the second area side adjacent to the boundary are arranged as a second color set to be closer to the first color set. Accordingly, when the index signal is offset to the first area side and when the index signal is offset to the second area side, it is possible to cause the offset of the index signal to appear in the adjustment image.

The first area is an area for adjusting color components of light by reflecting light emitted from the semiconductor laser 31, and the second area is an area for adjusting color components of light by transmitting the light emitted from the semiconductor laser 31. Accordingly, it is possible to provide an adjustment image associated with a wheel including both the area for adjusting color components of light by reflecting reflected light and the area for adjusting color components of light by transmitting the light.

The first area and the second area are areas that generate different colors by adjusting color components of light emitted from the semiconductor laser 31. Accordingly, for example, it is possible to provide an adjustment image associated with a color wheel in which areas generate different colors by transmission (or reflection).

The image display device 10 further includes the parameter adjusting unit 64. The parameter adjusting unit 64 is characterized in that settings for determining a logical boundary in control of the wheel 35 are adjusted in order to reduce a difference in the boundary between the first area and the second area which is specified on the basis of the index signals generated by detecting indexes provided to correspond to the boundary between the first area and the second area in rotation control of the wheel 35 on the basis of the adjustment image projected by the projection unit 63 and the physical boundary of the wheel 35. Accordingly, it is possible to use the adjustment image to perform adjustment for reducing a difference between the logical boundary and the boundary specified on the basis of the index signal.

The parameter adjusting unit. 64 performs adjustment such that the boundary line of the first color and the second color in the adjustment image projected by the projection unit 63 is not visible. Accordingly, when the logical boundary and the boundary specified on the basis of the index signals are offset, adjustment can be performed using characteristics of the adjustment image in which a variation in gradation is fast and a geometric pattern appears.

It should be noted that the embodiment is not to be limited to the aforementioned embodiments, and that modifications, improvements, etc. within a scope that can achieve the objects of the embodiment are also included in the embodiment.

In the above-mentioned embodiment, the wheel 35 which is a wheel including a transmission area and a reflection area is exemplified as a wheel to which the embodiment is applied, but the invention is not limited thereto. This embodiment can be generally applied to detection of a boundary in a general color wheel in which all areas are transmission areas (or all areas are reflection areas). For example, this embodiment can be generally applied to detection of boundary portions of a color wheel including R, C, and B areas (or a color wheel including, for example, areas of White (W), Cyan (C), and Yellow (Y) in addition thereto). An example of a fluorescent substance used as a reflection area generates green from blue light source has been described above, but the invention is not limited thereto and red or yellow fluorescent substance may be used. Alternatively, reflection areas of a plurality of colors such as a red fluorescent area and a green fluorescent area may be formed on a single wheel.

In the above-mentioned embodiment, a user watches an adjustment image with the eyes and adjusts the index parameter, but the invention is not limited thereto. For example, colors of areas of the adjustment image may be detected using a measuring instrument that measures colors and the magnitude of the difference therebetween may be determined. Then, the parameter adjusting unit 64 may adjust the index parameter on the basis of the determination results.

The processing sequence described above can be executed by hardware, and can also be executed by software. In other words, the hardware configuration of FIG. 2 is merely illustrative examples, and the embodiment is not particularly limited thereto. More specifically, the types of functional blocks employed to realize the above-described functions are not particularly limited to the examples shown in FIG. 2, so long as the image display device 10 can be provided with the functions enabling the aforementioned processing sequence to be executed in its entirety.

A single functional block may be constituted by a single piece of hardware, a single installation of software, or a combination thereof.

The functional configurations of the present embodiment are realized by a processor executing arithmetic processing, and processors that can be used for the present embodiment include a unit configured by a single unit of a variety of single processing devices such as a single processor, multi-processor, multi-core processor, etc., and a unit in which the variety of processing devices are combined with a processing circuit such as ASIC (Application Specific Integrated Circuit) or FPGA (Field-Programmable Gate Array).

In the case of having the series of processing executed by software, the program constituting this software is installed from a network or storage medium to a computer or the like. The computer may be a computer equipped with dedicated hardware. In addition, the computer may be a computer capable of executing various functions, e.g., a general purpose personal computer, by installing various programs.

The storage medium containing such a program can not only be constituted by the removable medium 101 of FIG. 1 distributed separately from the device main body for supplying the program to a user, but also can be constituted by a storage medium or the like supplied to the user in a state incorporated in the device main body in advance. The removable medium 101 is composed of, for example, a magnetic disk (including a floppy disk), an optical disk, a magnetic optical disk, or the like. The optical disk is composed of, for example, a CD-ROM (Compact Disk-Read. Only Memory), a DVD (Digital Versatile Disk), Flu-ray (Registered Trademark) or the like. The magnetic optical disk is composed of an MD (Mind-Disk) or the like. The storage medium supplied to the user in a state incorporated in the device main body in advance is constituted by, for example, semiconductor memories, and the like included in the storage unit 52 in which the program is recorded of FIG. 1.

It should be rioted that, in the present specification, the steps defining the program recorded in the storage medium include not only the processing executed in a time series following this order, but also processing executed in parallel or individually, which is not necessarily executed in a time series. Further, in this specification, the term of the system shall mean an entire apparatus composed of a plurality of apparatuses, a plurality of means and the like.

The embodiments of the present invention described above are only illustrative, and are not to limit the technical scope of the present invention. The embodiment can assume various other embodiments. Additionally, it is possible to make various modifications thereto such as omissions or replacements within a scope not departing from the spirit of the embodiment. These embodiments or modifications thereof are within the scope and the spirit of the invention described in the present specification, and within the scope of the invention recited in the claims and equivalents thereof.

What is claimed is:

1. An adjustment image generating device comprising:
   a light source unit that emits light;
   a wheel that includes a first area and a second area as areas for adjusting color components of the light emitted from the light source unit; and
   a processor,
   wherein the processor is configured to:
   generate an adjustment image in which a first color formed using a section adjacent to a boundary between the first area and the second area and a second color formed not using the section adjacent to the boundary and having color components close to the first color are arranged adjacent to each other,
   perform the light source unit to project the adjustment image.

2. The adjustment image generating device according to claim 1, wherein the processor is configured to:
   select colors which are different by one gradation in color components adjusted in the first area and the second area respectively, as the first color and the second color and generates the adjustment image.

3. The adjustment image generating device according to claim 1, wherein the processor is configured to:
   generate an adjustment image in which the first color on the first area side using a section on the first area side adjacent to the boundary and the second color on the first area side not using a section on the first area side adjacent to the boundary are arranged as a first color set and the first color on the second area side using a section on the second area side adjacent to the boundary and the second color on the second area side not using a section on the second area side adjacent to the boundary are arranged as a second color set to be closer to the first color set.

4. The adjustment image generating device according to claim 2, wherein the processor is configured to:

generate an adjustment image in which the first color on the first area side using a section on the first area side adjacent to the boundary and the second color on the first area side not using a section on the first area side adjacent to the boundary are arranged as a first color set and the first color on the second area side using a section on the second area side adjacent to the boundary and the second color on the second area side not using a section on the second area side adjacent to the boundary are arranged as a second color set to be closer to the first color set.

5. The adjustment image generating device according to claim 1, wherein the first area is an area for adjusting color components of light by reflecting the light emitted from the light source unit and the second area is an area for adjusting color components of the light by transmitting the light emitted from the light source unit.

6. The adjustment image generating device according to claim 1, wherein the first area and the second area are areas for generating different colors by adjusting color components of the light emitted from the light source unit.

7. The adjustment image generating device according to claim 1, wherein the processor is configured to:

adjust a set value for determining a logical boundary in control of the wheel in order to decrease a difference between the boundary between the first area and the second area in rotation control of the wheel and the boundary between the first area and the second area specified on the basis of an index signal generated by detecting an index provided to correspond to a physical boundary of the wheel on the basis of the adjustment image projected by light source unit.

8. The adjustment image generating device according to claim 7, wherein the adjustment process includes performing adjustment such that a boundary line between the first color and the second color in the adjustment image projected in the projection process is not visible.

9. The adjustment image generating device according to claim 7, further comprising an operation unit that receives a rotation timing adjusting operation of the wheel by a user, wherein the processor is configured to:

adjust a set value for determining a logical boundary in control of the wheel on the basis of results of the operation by the user detected by the operation unit.

10. The adjustment image generating device according to claim 8, further comprising an operation unit that receives a rotation timing adjusting operation of the wheel by a user, wherein the processor is configured to:

adjust a set value for determining a logical boundary in control of the wheel on the basis of results of the operation by the user detected by the operation unit.

11. An adjustment image generating method which is performed by a device, wherein the method including a light source unit that emits light, a wheel that includes a first area and a second area as areas for adjusting color components of the light emitted from the light source unit, and a processor, the adjustment image generating method comprising:

generating an adjustment image in which a first color formed using a section adjacent to a boundary between the first area and the second area and a second color formed not using the section adjacent to the boundary and having color components close to the first color are arranged adjacent to each other; and projecting the adjustment image generated in the generating of the adjustment image.

12. A nonvolatile storage medium storing an adjustment image generating program which is executed by an adjustment image generating device including a light source unit that emits light, a wheel that includes a first area and a second area as areas for adjusting color components of the light emitted from the light source unit, and a processor, the adjustment image generating program performing:

a generation process of generating an adjustment image in which a first color formed using a section adjacent to a boundary between the first area and the second area and a second color formed not using the section adjacent to the boundary and having color components close to the first color are arranged adjacent to each other, a projection process of projecting the adjustment image generated in the generation process.

\* \* \* \* \*